United States Patent
Pool

(10) Patent No.: US 6,433,530 B1
(45) Date of Patent: Aug. 13, 2002

(54) HAND HELD CIRCUIT AND POLARITY TESTER

(75) Inventor: James L. Pool, Clarinda, IA (US)

(73) Assignee: Lisle Corporation, Clarinda, IA (US)

( * ) Notice: Subject to any disclaimer, the term of this patent is extended or adjusted under 35 U.S.C. 154(b) by 16 days.

(21) Appl. No.: 09/740,344

(22) Filed: Dec. 18, 2000

(51) Int. Cl.[7] .................. G01R 31/02; G01R 19/14; G01R 31/00; H01H 31/02
(52) U.S. Cl. ............... 324/72.5; 324/133; 324/556; 324/537; 324/414; 324/74
(58) Field of Search ................. 324/72.5, 133, 324/556, 74, 414, 537

(56) References Cited

U.S. PATENT DOCUMENTS 2,917,705 A * 12/1959 Clough ................ 324/510
4,005,362 A * 1/1977 Fortino ................ 324/556
4,005,365 A * 1/1977 Berger et al. ............ 324/133
4,540,940 A * 9/1985 Nolan ................. 324/133
4,584,526 A * 4/1986 Labastov .............. 324/133
4,825,150 A * 4/1989 Sirasud ............... 324/133
5,270,638 A * 12/1993 Mellott ............... 324/133
5,572,143 A * 11/1996 Myers et al. ............ 324/555
5,604,436 A * 2/1997 Henritzy et al. ......... 324/414
5,789,911 A * 8/1998 Brass ................. 324/556

* cited by examiner

Primary Examiner—N. Le
Assistant Examiner—Wasseem H. Hamdan
(74) Attorney, Agent, or Firm—Banner & Witcoff, Ltd.

(57) ABSTRACT

A circuit testing device includes a handle with a hollow interior, a conductive probe projecting from one end and a removable cap with a wire and clamp projecting from the opposite end A subassembly retained within a counterbore in the handle includes a polarity sensitive buzzer and light in a parallel circuit configuration whereby the device is useful for determining polarity, circuit continuity, and battery drain.

8 Claims, 4 Drawing Sheets

HAND HELD CIRCUIT AND POLARITY TESTER

BACKGROUND OF THE INVENTION

In a principal aspect the present invention relates to a device for testing electric circuits, and more particularly, a hand held circuit testing device which includes various attachments that interact with leads and contacts and wherein the circuit testing device provides a visual, as well as an audio indication of a closed circuit, a polarity, short circuit and battery drain test.

Modem vehicles often include a wide variety of electrical items all powered by a direct current battery. Such items are typically incorporated in low voltage circuits, e.g. 28 volts or less. Often, the wiring in a vehicle is difficult to access and since there may be multiple electrically driven components, circuit checking and circuit testing with respect to each of those multiple components and items is time consuming and complex. Thus, troubleshooting the electrical system of a motor vehicle is often a particularly challenging task.

Consequently, there has developed a need for a device which will enable and facilitate easy testing of circuits in such an environment. Such testing includes the need to identify short circuits, to check circuits from a distance, to check polarity, to check battery drain, and to check whether the circuit is a complete and closed circuit. Often, attempting to check such circuits using a device which operates a light in response to a low voltage current flow is inadequate for diagnostic and vehicle repair situations. Audio responses are often required inasmuch as the light may not be visible to the mechanic. In sum, there has developed an important need for a compact, portable, low voltage circuit testing device or kit.

SUMMARY OF THE INVENTION

Briefly, the present invention relates to a circuit testing device which provides both audio and visual indication of a direct current voltage. Te device is in the form, shape and size of a typical heavy duty screwdriver with lead wires and probes project from the opposite ends of the device for connection to wires and contacts associated with a circuit to be tested. Thus, the device includes a hollow handle with an audio buzzer and light subassembly slidably mounted in the handle and with lead probes and/or wires projecting from the opposite ends of the handle electrically connected to the subassembly. When a closed circuit is sensed, a buzzer, as well as a light, provides indication of voltage. The buzzer is, preferably, polarity sensitive in order to give the user of the tool or device additional flexibility when diagnosing and servicing low voltage electric circuits typically as incorporated in motor vehicles. It is noted, however, tat the circuit testing device, or kit, may be used in any environment where low voltage testing is appropriate and thus, the use of the device is not limited to the automotive or vehicle repair field. The audio buzzer and the electric light are retained within a translucent handle. They are mounted on a transportable bracket and are maintained in parallel electric array in the test circuit.

Thus, it is an object of the invention to provide a circuit testing device which works in and for circuits having a low voltage wherein the device can be used to perform multiple functions including detection of a short circuit, detection of circuit continuity remotely by a sound indicator, detection of polarity in a circuit, and investigation and determination of battery drain.

It is a further object of the invention to provide an easily manipulated circuit testing device which is manually operated and which includes various attachments to facilitate the test protocol desired by the user.

Another object of the invention is to provide a rugged and dependable circuit testing device which may be assembled and disassembled easily to permit ease of repair and replacement of parts.

Yet another object of the invention is to provide a circuit testing device which is not costly.

These and other objects, advantages and features of the invention will be set forth in the detailed description which follows.

BRIEF DESCRIPTION OF THE DRAWING

In the detailed description which follows, reference will be made to the drawing comprised of the following figures.

DESCRIPTION OF THE PREFERRED EMBODIMENT

Figure 1:
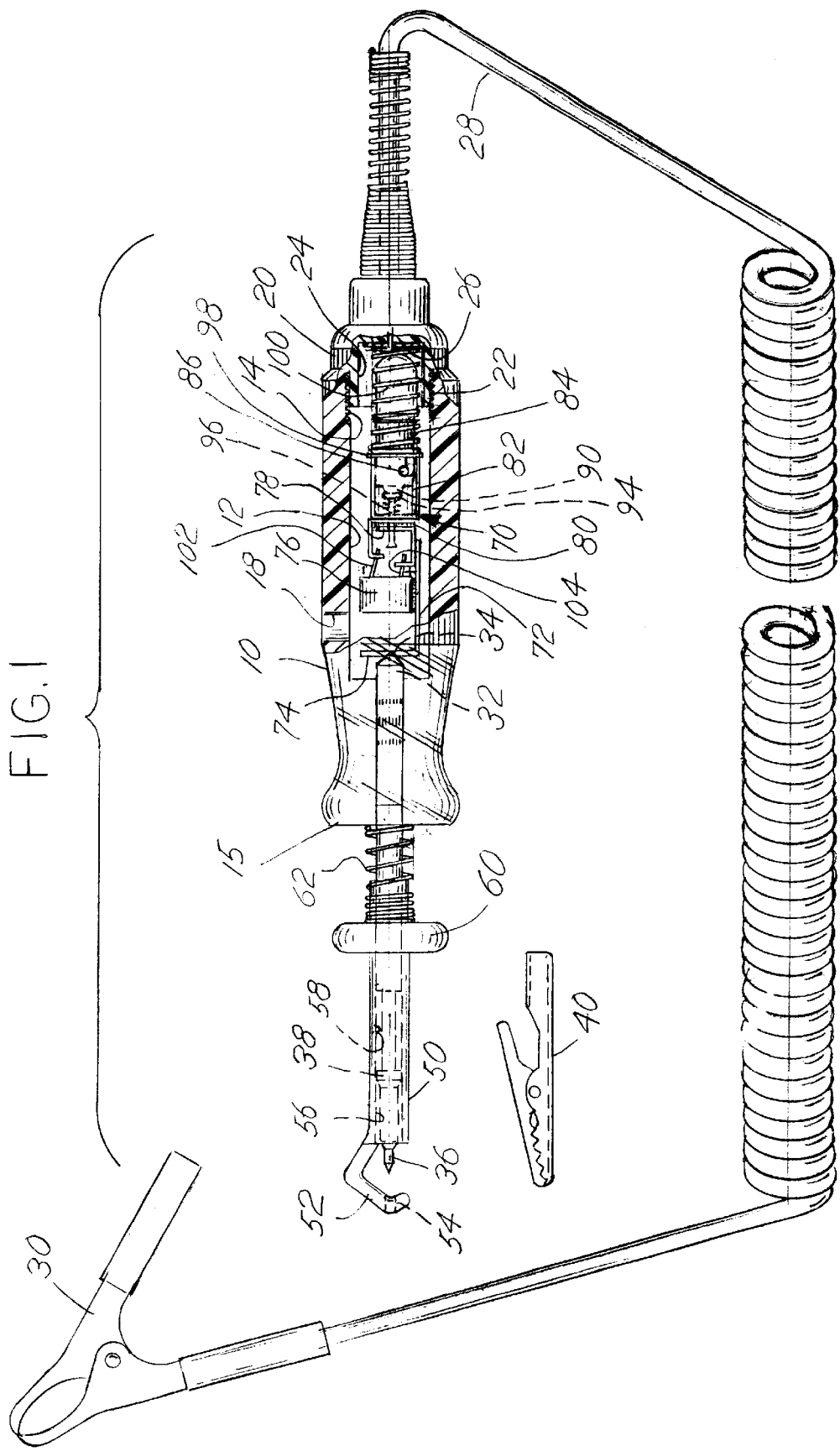
FIG. 1 is a plan view of the circuit testing device in accord with the invention including depiction of an optional clip and a wire retention probe.
Figure 1A:
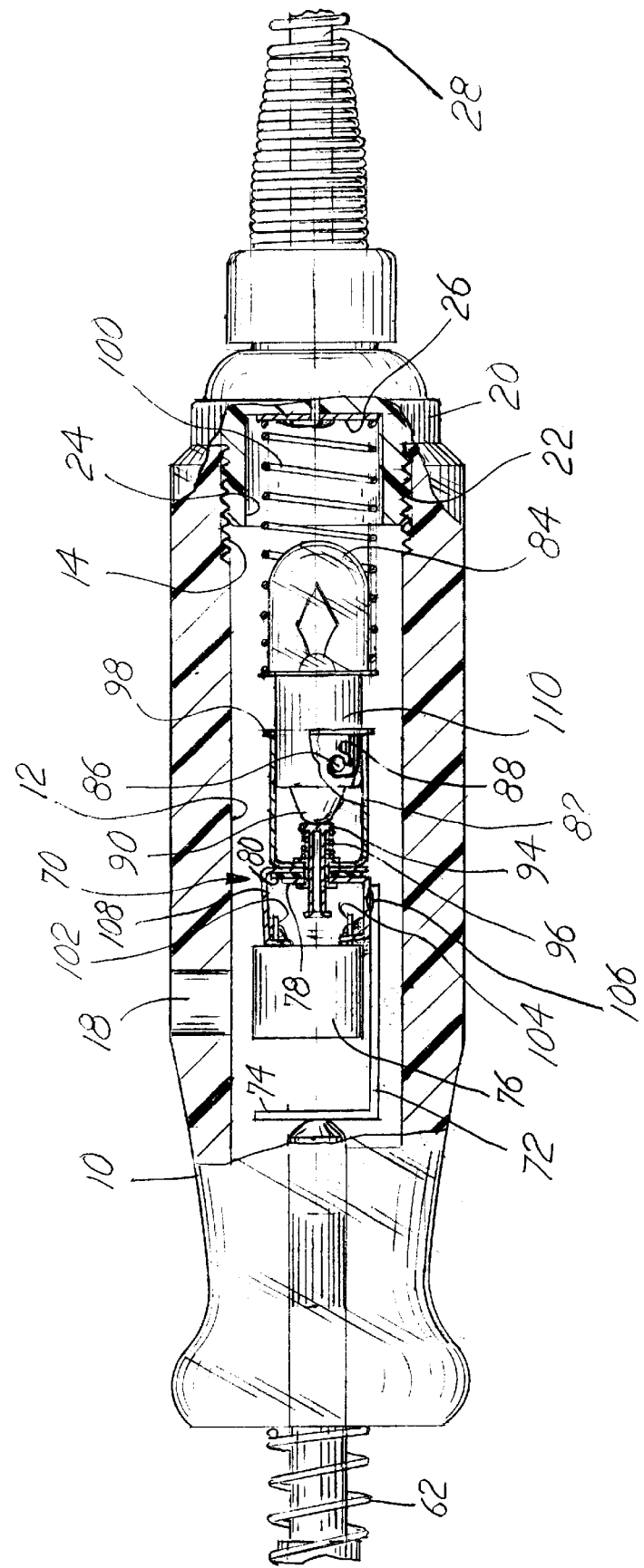
FIG. 1A is an enlarged, partial cross sectional plan view of the handle of the circuit tester.
Figure 2:
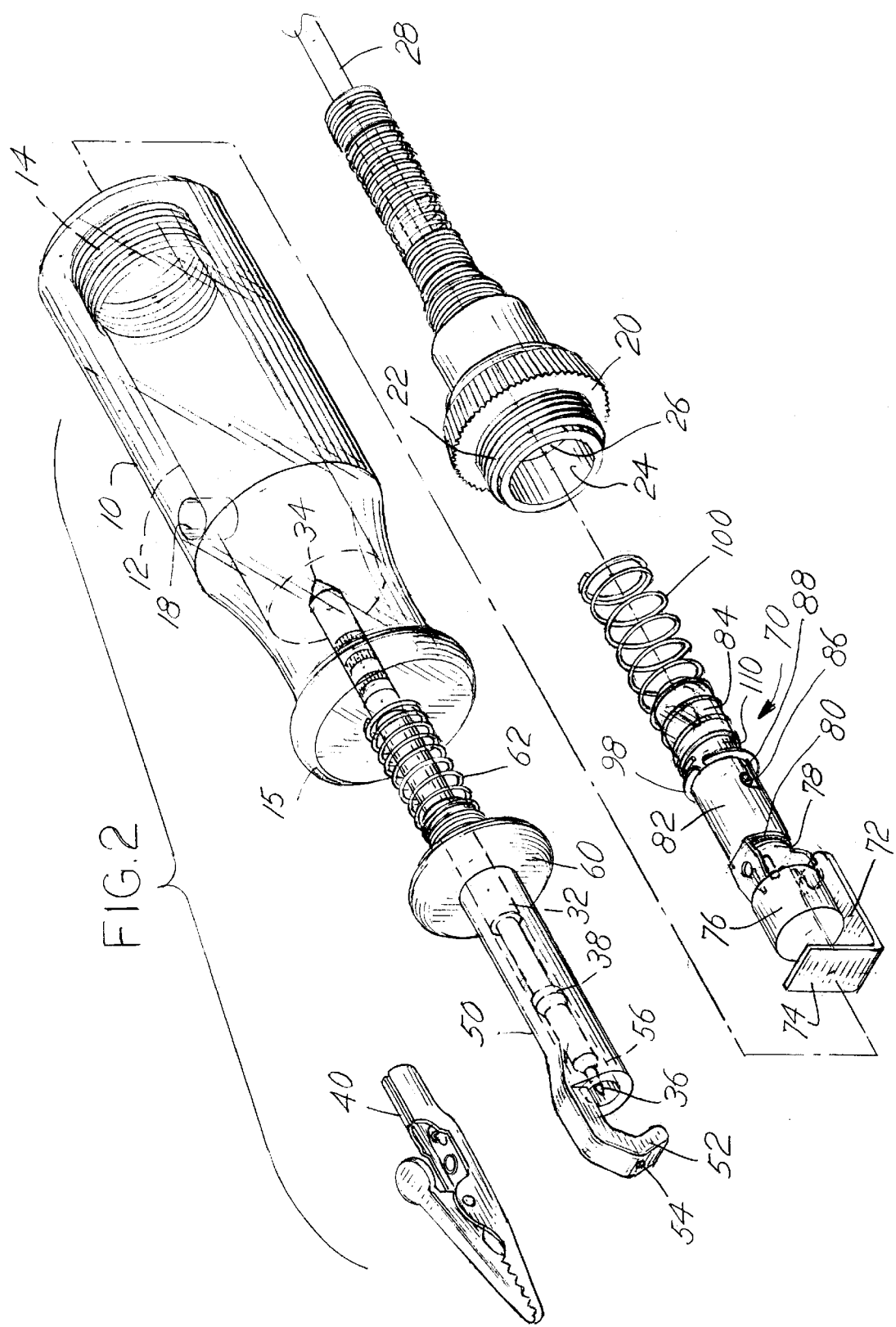
FIG. 2 is an exploded isometric view of the device of FIG. 1.

Referring to the figures, the circuit testing device of the invention includes a handle 10 having the form of a typical screwdriver handle. The handle 10 is generally hollow and includes a uniform diameter counterbore 12 which is accessible from one end of the handle 10 through a threaded opening 14. The counterbore 12 is centered axially within the handle 10 and extends from the opening or end 14 substantially through the handle 10 toward the opposite end 15. Intermediate the ends 14, 15 of the handle 10 is a passage 18 through a side wall leading to the counterbore 12. Passage 18 allows sound from a buzzer (described below) to be emitted from the counterbore 12 in the handle 10 so that it may be heard by a user of the circuit testing device. Typically, the handle 10 is made from a translucent or transparent molded plastic material.

The open end 14 of the handle 10 is adapted to receive a cap 20 which includes a threaded projection 22 that screws into the open end 14 of the handle 10. An axial counterbore 24 in cap 20 extends inwardly into the cap 20, and a contact 26 is provided at the inside or interior end of the counterbore 24. A lead wire 28 with an end clamp 30 extends from the cap 20 and is connected to the contact 26. The contact 26, lead wire 28 and clamp 30 may thus form part of an electric, low voltage d.c. circuit.

At the opposite end of the handle 10, a metallic, electrically conductive metal probe 32 extends axially. The probe 32 includes an inner contact, or first contact, 34 on the inside of the counterbore 12. The probe 32 extends axially from the contact 34 through the end 15 of the handle 10 and terminates with a point 36. Reduced diameter section 38 is provided on the probe 32 adjacent point 36 at end 37 for cooperation with a telescoping fitting 50 described in greater detail below.

The end or section 37 of the probe 32 is adapted to slidably receive an alligator clip contact 40. The alligator clip 40 may be used to provide electrical contact through the probe 32 to the interior of the handle 10, namely, to the counterbore 12, and more particularly to a sensor subassembly 70 (described below). When clip 40 is removed, the point 36 may be used to engage with a wire or contact and thereby provide an electrical circuit to the interior counterbore 12 of the handle 10.

A telescoping, slidably insertable fitting 50, typically made from a plastic, nonconductive material, includes an end hook 52 which is axially aligned with the point 36. More particularly, a passage 54 in the hook 52 is aligned with the point 36. The fitting 50 includes an axial bore or throughpassage 56 with an internal rib 58. The throughpassage 56 has a shape and diameter which enables mounting the fitting 50 telescopically on the probe 32. The reduced diameter section 38 of the probe 32 results in an annular flange 39 which in combination with the flexible, internal rib 58 serve to retain the fitting 50 on the probe 32. The fitting 50 is thus retained on the reduced diameter section 38 by the rib 58 which impinges against flange 39 to limit axial travel of fitting 50.

A circumferential radially extending flange 60 of fitting 50 provides a dual function. That is, a spring 62 interposed between the end 15 of the handle 10 and flange 60 biases the fitting 50 away from the handle 10 toward engagement with flange 39 of probe 32. The flange 60 may be manually gripped to counteract the spring force of spring 62 thereby axially telescoping the fitting 50 and thus moving the hook 52 toward engagement with point 36 to hold or retain an insulated wire by means of the hook 52 against the probe 36. This action also permits the probe 36 to pierce the insulation on the wire held by hook 52 and thereby provide an electrical circuit.

An important feature of the invention is the sensor subassembly 70 which slides into the counterbore 12. The sensor subassembly 70 comprises bulb socket 82 joined with a conductive mounting bracket 72. Bracket 72 includes an upwardly depending bracket arm 74 for engagement with the probe contact 34. A polarity sensitive buzzer 76 is mounted on the bracket 72. The bracket 72 is soldered to an inside solder contact 106. The inside solder contact 106 connects to spring loaded center contact pin 94 in bulb socket 82. The bulb socket 82 receives a light bulb 84 which includes a pin 86 that mechanically engages with a retention slot 88 in the socket 82. The outer shell of the bulb 84 is thus mechanically and electrically connected to the bulb socket 82 by a pin 86. A center contact 90 of the bulb 84 engages with the conductive contact pin 94 biased by a spring 96 into engagement with the contact 90. The contact pin 94 is in electrical contact with an inside solder contact 106 thus providing a circuit connection.

Bulb 84 includes a snap ring 98, and a biasing spring 100 is positioned over the snap ring 98 to provide an electrical connection as well as a mechanical connection between the snap ring 98, bulb base 110 and the contact 26 within the counterbore 24. Thus, the spring 100 provides electrical as well as mechanical contact. The spring 100 also biases the entire subassembly 70 into the counterbore 12 and insures that positive electrical contact will be maintained between contact 34, bracket 72, and also between center light contact 26, and bulb socket 82.

The buzzer 76 includes a first lead 102 connected through outside solder contact 108 to bulb socket 82 and a second lead 104 which is connected to the inside solder contact 106, bracket 72 and contact 94. In this manner, the buzzer 76 is provided in parallel circuitry with the bulb 84.

The inside contact 106 comprises a bracket, is mechanically and electrically attached to bracket 72, and is mechanically attached to bulb socket 82 by means of an insulating member 85. A rivet 87 with a through passage 89 retains the contact 106 outside contact 108, socket 82 and insulator 85 joined together. The contact 94 is telescopically mounted in passage 89.

The buzzer 76 is preferably a polarity sensitive buzzer which provides sound only when the leads are connected in a manner wherein the clamp 30 is attached to a negative contact. In such a circumstance, the probe 32 will be connected to a positive contact. Reversal of the polarity of contacts will not result in any buzzer sound even though the bulb 84 may be illuminated. The buzzer 76 thus provides a polarity responsive audio sound.

Figure 3:
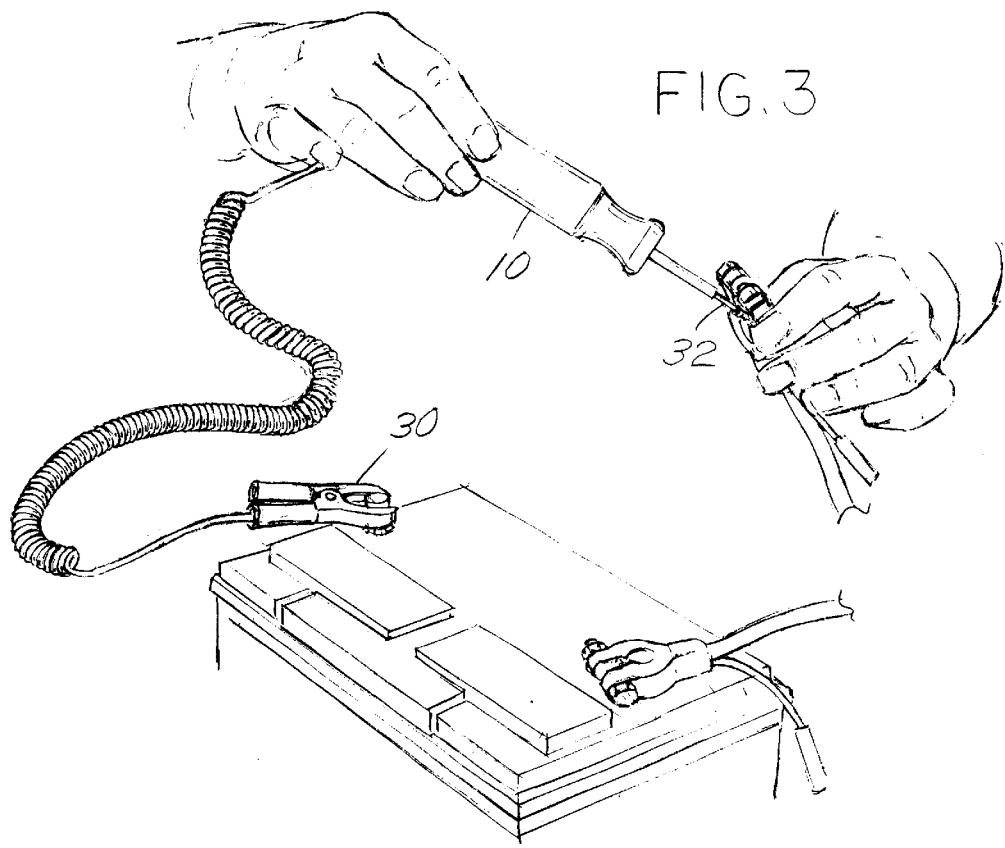
FIG. 3 is an isometric view illustrating use of the circuit testing device to investigate battery drain.
Figure 4:
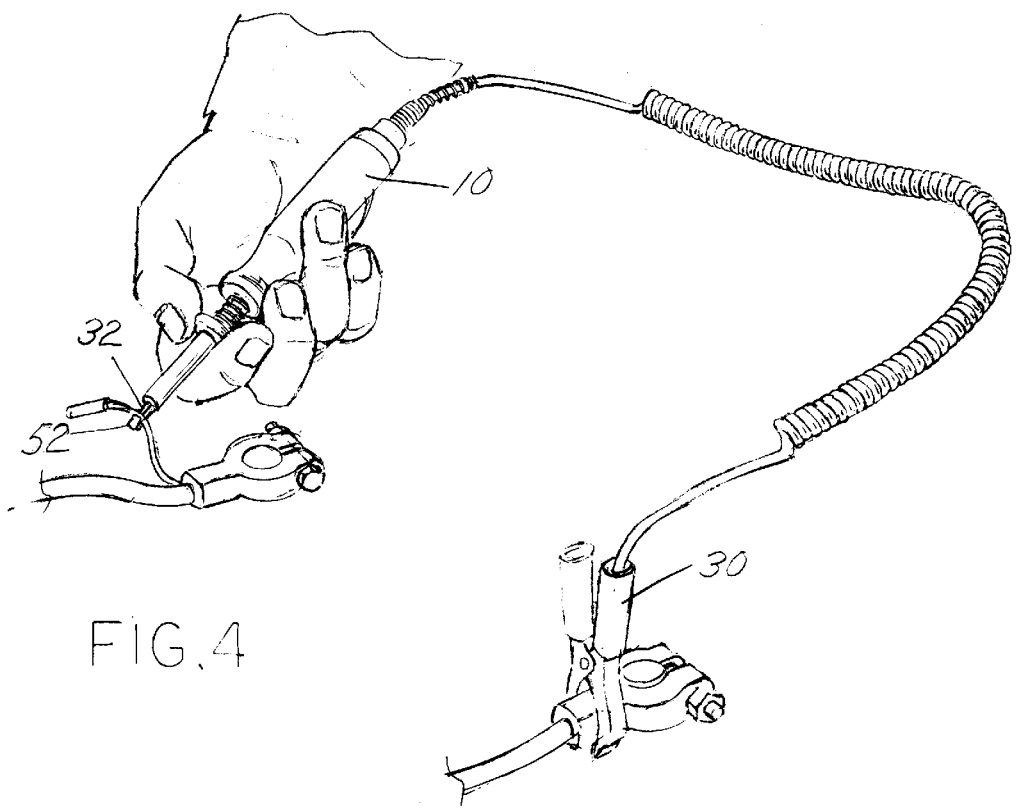
FIG. 4 is an isometric view of the use of the circuit testing device to investigate polarity.

FIGS. 3 and 4 illustrate various modes of operation of the circuit tester. FIG. 3 illustrates an arrangement to check whether a battery is being drained. The protocol followed requires that the ignition and all switches in the vehicle are in the off position. The negative battery cable would then be removed. The ground clip or clamp 30 is then connected to the negative battery post and the probe 32 is attached to the negative battery cable. If the light and buzzer activate, then the vehicle is drawing 200 milliamps or more. That will indicate, of course, a battery drain situation.

FIG. 4 illustrates the use of the testing device to check polarity. In such a circumstance, the clamp 30 is attached to ground and the probe 32 to a wire. If the light 84 and buzzer 76 both are activated, the probe is connected to a positive contact. If the light 84 only activates, then the probe 32 is contacted to a negative pole or contact.

There are many other uses of the testing kit as described. The subassembly 70 construction, for example, may be varied without departing from the spirit, scope and functionality of the invention. The invention is, therefore, to be limited only by the following claims and equivalents thereof.

What is claimed is:

1. A circuit testing device comprising in combination:
   a handle having a central body, a first end, an opposite second end, and a counterbore extending from an opening at one of said ends into the central body;
   a cap removably attached to the handle at the counterbore opening, said cap including a first inside electrical contact;
   a conductive probe attached to the handle at the end opposite the opening and projecting therefrom, said probe further including a second electrical contact positioned in the counterbore;

a conductive member extending from said cap and connected electrically to said first contact on the inside of the cap, said conductive member comprising a spring member; and a sensor subassembly slidably mounted in the counterbore opening, said subassembly including a bracket electrically connected in a series circuit to the second contact in the counterbore and also to the first inside contact of the cap, said spring member comprising a mechanical and electrical connection to the bracket from the first contact and for biasing the subassembly into electrical contact with the second contact, said subassembly further including an electrically activated buzzer and a visible light mounted on the bracket in parallel electrically between the first and second contacts.

2. The device of claim 1 wherein the handle is translucent or transparent.

3. The device of claim 1 wherein the buzzer sensor is polar.

4. The device of claim 1 wherein the probe, the counterbore and the cap are axially aligned.

5. The device of claim 1 wherein the handle includes a passage to the counterbore for sound transmission.

6. The device of claim 1 wherein the probe includes a piercing point for making electrical contact.

7. The device of claim 1 wherein the probe includes a removable, friction fitted alligator electrical connector.

8. The device of claim 1 wherein the probe includes a fitting for gripping and holding a wire engaged with the probe point, said fitting comprising a housing with a throughbore for sliding engagement with the probe, a hook at one end of the housing aligned with the point, a biasing member intermediate the handle and housing for biasing the housing away from the handle and a detent in the throughbore for limiting the sliding movement of the housing on the probe.

\* \* \* \* \*